United States Patent [19]

Komatsu et al.

[11] 4,438,556
[45] Mar. 27, 1984

[54] METHOD OF FORMING DOPED POLYCRYSTALLINE SILICON PATTERN BY SELECTIVE IMPLANTATION AND PLASMA ETCHING OF UNDOPED REGIONS

[75] Inventors: Shigeru Komatsu, Yokohama; Michio Nakamura, Kawasaki, both of Japan

[73] Assignee: Tokyo Shibaura Denki Kabushiki Kaisha, Kawasaki, Japan

[21] Appl. No.: 332,973

[22] Filed: Dec. 21, 1981

[30] Foreign Application Priority Data

Jan. 12, 1981 [JP] Japan .................................. 56-2988
Apr. 9, 1981 [JP] Japan .................................. 56-53393

[51] Int. Cl.³ .................. H01L 21/302; H01L 21/225; C23F 1/02
[52] U.S. Cl. .................................. 29/576 B; 29/571; 148/1.5; 148/187; 156/628; 156/643; 156/644
[58] Field of Search .................. 148/1.5, 187; 29/571, 29/576 B; 156/643, 644, 628; 357/58

[56] References Cited

U.S. PATENT DOCUMENTS

| | | | |
|---|---|---|---|
| 3,738,880 | 6/1973 | Laker | 156/628 |
| 3,980,507 | 9/1976 | Carley | 156/628 |
| 4,092,209 | 5/1978 | Ipri | 156/628 |
| 4,093,503 | 6/1978 | Harris | 156/628 |
| 4,209,350 | 6/1980 | Ho et al. | 148/1.5 |

FOREIGN PATENT DOCUMENTS

| | | |
|---|---|---|
| 2723933 | 6/1978 | Fed. Rep. of Germany . |
| 2433833 | 3/1980 | France . |
| 51-16267 | 6/1972 | Japan . |
| 56-56636 | 10/1979 | Japan . |
| 55-157234 | 12/1980 | Japan . |

OTHER PUBLICATIONS

Götzlich et al., J. Electrochem. Soc. 128, (1981), 617.
Briska et al., IBM-TBB, 23 (1980), 199.

Primary Examiner—Upendra Roy
Attorney, Agent, or Firm—Finnegan, Henderson, Farabow, Garrett & Dunner

[57] ABSTRACT

A process of forming a polycrystalline silicon pattern which is used for a semiconductor device, wherein the degree of side etching is low and the obtained pattern is of high precision. Firstly, a polycrystalline silicon layer is deposited on a semiconductor substrate or on an insulating film which is formed on a semiconductor substrate. An impurity is selectively ion-implanted with high concentration into the region in the layer which is to remain as a polycrystalline silicon pattern. Finally, whole of the polycrystalline silicon layer into which the impurity is thus selectively ion-implanted is plasma-etched to etch off the areas into which the impurity is not ion-implanted.

15 Claims, 28 Drawing Figures

F I G. 3A
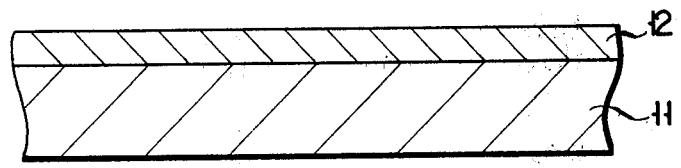
F I G. 3B
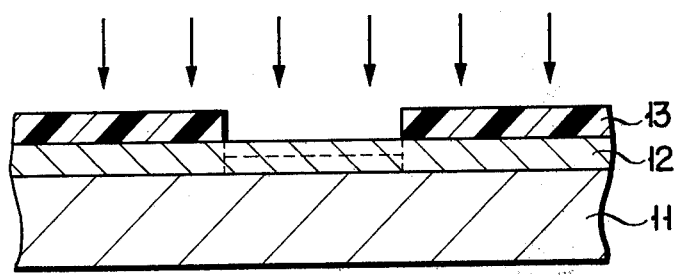
F I G. 3C
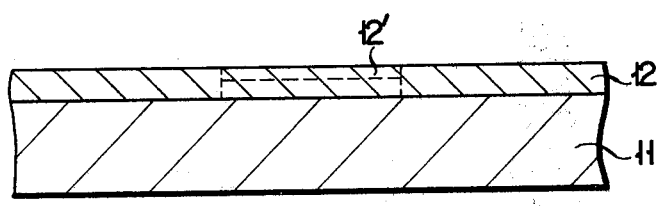
F I G. 3D
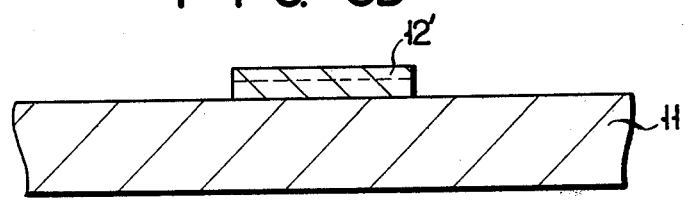

F I G. 8
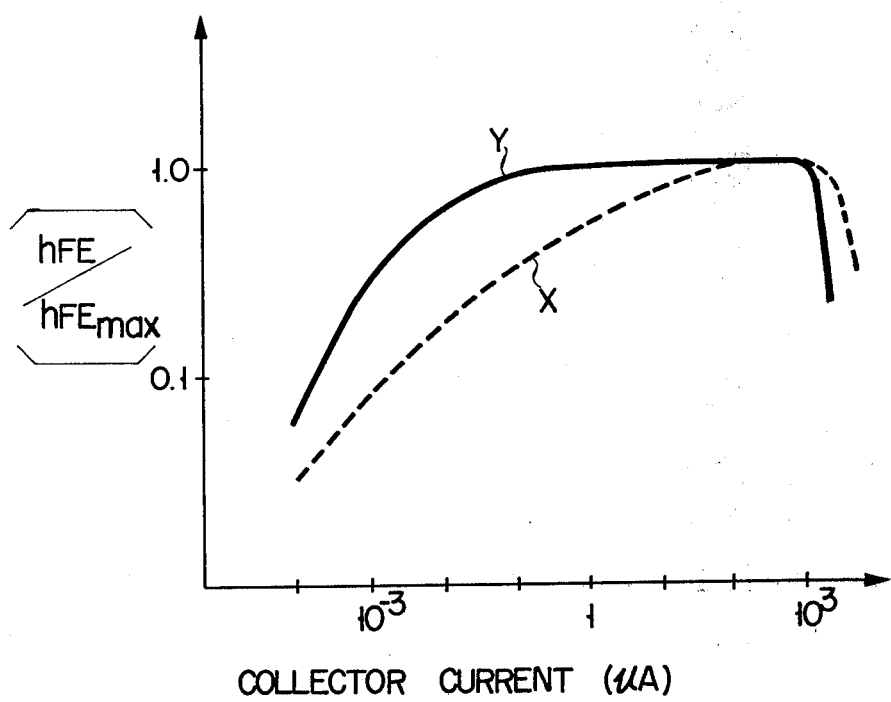
COLLECTOR CURRENT (μA)
F I G. 9
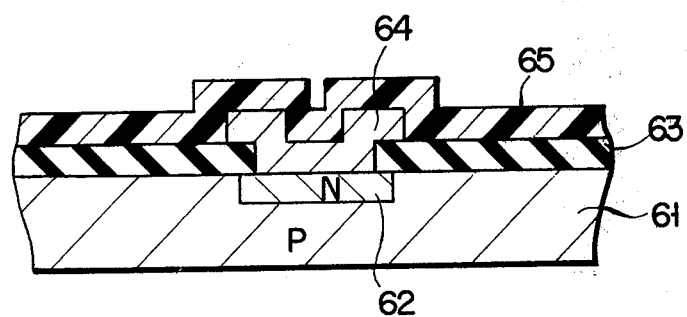

METHOD OF FORMING DOPED POLYCRYSTALLINE SILICON PATTERN BY SELECTIVE IMPLANTATION AND PLASMA ETCHING OF UNDOPED REGIONS

BACKGROUND OF THE INVENTION

1. Field of the Invention

The present invention relates to a process of forming a polycrystalline silicon pattern which is used for a semiconductor device.

2. Description of the Prior Art

A polycrystalline silicon pattern is widely used as wiring and an electrode in a semiconductor device (including a gate electrode of a MOS transistor). In general, an impurity is doped in the wiring and electrode which are made of polycrystalline silicon in order to reduce the electric resistance. Especially, an electrode of polycrystalline silicon in which an impurity of high concentration is doped and which is formed to be in direct contact with an impurity region of a semiconductor substrate is also used as the diffusion source to form an impurity region. The wiring or electrode which is made of polycrystalline silicon is conventionally formed by selective etching using a photoresist mask as follows (See FIG. 1).

(1) A polycrystalline silicon layer 2 is deposited on a substrate 1 which is made of a semiconductor or insulator by the chemical vapor deposition method (CVD method). A photoresist film 3, the pattern of which is the same as a prospective pattern of the polycrystalline silicon layer 2, is formed on the polycrystalline silicon layer 2 by the Photo Engraving Process (PEP) (FIG. 1A).

(2) The polycrystalline silicon layer 2 is etched, using the photoresist film 3 as a mask, so that a desired pattern for the polycrystalline silicon layer 2 is formed (FIG. 1B).

However, the following drawbacks are presented in the conventional process. When selective etching of the polycrystalline silicon layer 2 is performed by using the photoresist film 3 as the mask, the polycrystalline silicon pattern is side-etched so that the area which is protected by the photoresist film 3 is slightly etched as shown in FIG. 1B. As a result, the patterning precision is degraded and a process for forming an elaborate semiconductor device may not be accomplished. Further, when the polycrystalline silicon pattern is used as the wiring or resistance of the semiconductor device, an impurity is doped therein to reduce the electric resistance. However, when the polycrystalline silicon layer which is doped with an impurity is etched by the process as described above, it becomes more difficult to obtain a pattern with high precision because the polycrystalline silicon which is doped with an impurity has an etching rate by plasma etching higher than the polycrystalline silicon which is not doped with an impurity. Therefore, side etching of the pattern is increased. When the wiring or resistance which is made of polycrystalline silicon is to be formed, a polycrystalline silicon layer which is not doped with an impurity is first patterned and an impurity is then ion-implanted into the entire surface of the semiconductor device. However, even if a polycrystalline silicon layer which is not doped with an impurity is used, the patterning precision is not remarkably improved, due to the side etching. Further, ions become implanted in areas other than the polycrystalline silicon pattern and these areas are damaged, thus degrading the performance characteristics of the semiconductor device. When etching is performed using a photoresist film as a mask, the polycrystalline silicon pattern may not satisfy the requirements of high precision.

SUMMARY OF THE INVENTION

Accordingly, it is an object of the present invention to provide a process of forming a polycrystalline silicon pattern with high precision.

It is another object of the present invention to provide a process of forming a polycrystalline silicon pattern with high precision, in which a polycrystalline silicon pattern is formed and is used, without further doping, as a wiring, electrode or resistance of a semiconductor device.

It is still another object of the present invention to provide a process of forming a polycrystalline silicon pattern which operates as the wiring, electrode or resistance of the semiconductor device without degrading the performance characteristics of the semiconductor device.

In order to achieve the above and other objects of the present invention, there is provided a process of forming a polycrystalline silicon pattern which comprises the steps of:

selectively ion-implanting an impurity with high concentration into the region of a polycrystalline silicon layer, which is to remain as a polycrystalline silicon pattern; and plasma-etching the whole of the polycrystalline silicon layer to etch the areas of the polycrystalline silicon layer other than the region into which the impurity of high concentration is ion-implanted.

BRIEF DESCRIPTION OF THE DRAWINGS

FIGS. 3A to 3D are sectional views for explaining a process of forming a polycrystalline silicon pattern according to the present invention;

FIG. 8 is a graph for explaining differences in electric characteristics between a high frequency npn transistor, the electrode of which is made of the polycrystalline silicon formed by the process of the present invention, and a conventional high frequency npn transistor which is formed by patterning the polycrystalline silicon layer and doping an impurity into the entire surface of the semiconductor substrate; and FIG. 9 is a sectional view of an example of a semiconductor device whose electrode is made of the polycrystalline silicon formed by the process of the present invention.

DETAILED DESCRIPTION OF THE PREFERRED EMBODIMENTS

Figure 1A:
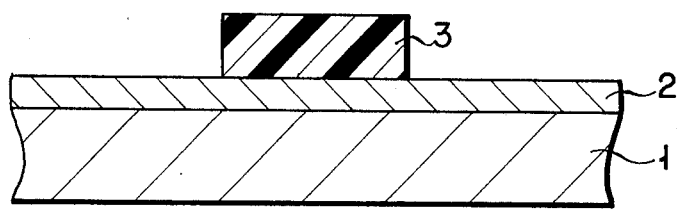
FIGS. 1A and 1B are sectional views for explaining a conventional process of forming a polycrystalline silicon pattern.
Figure 1B:
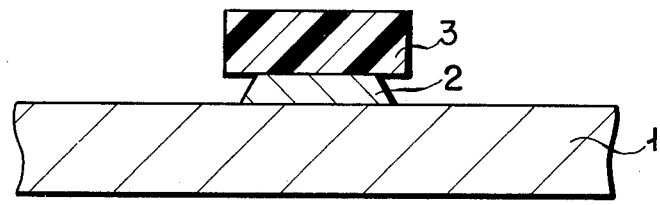
Figure 2:
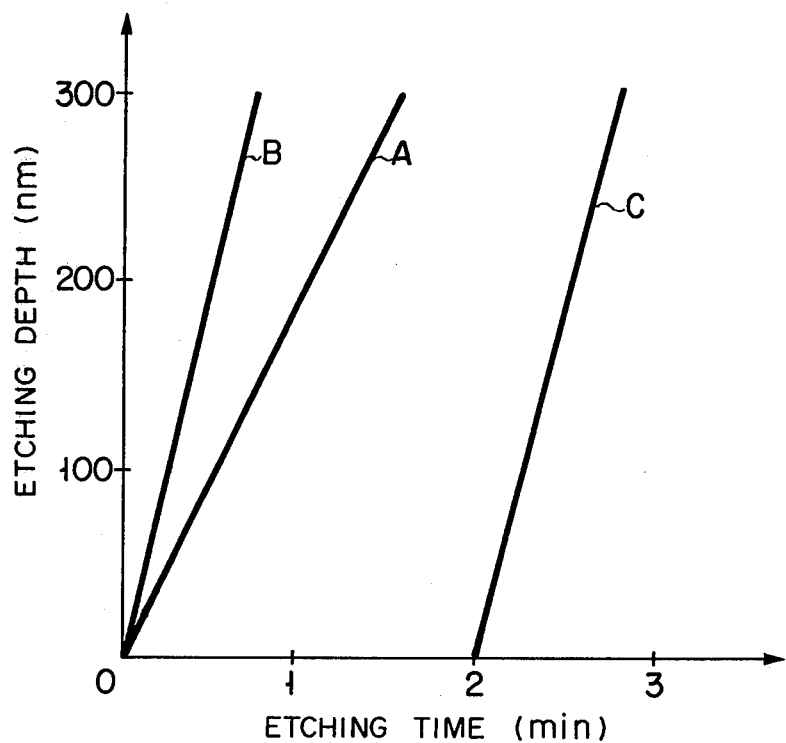
FIG. 2 is a graph showing each etching rate of three different polycrystalline silicon layers by plasma etching.

As described above, it may be apparent that a polycrystalline silicon pattern with high precision is not accomplished by etching using a photoresist film as a mask. The present invention provides a process of forming a polycrystalline silicon layer which is selectively etched, without using the photoresist film. The term "plasma etching" herein means etching in a plasma which is energized with a radio frequency. The etching rate of the polycrystalline silicon layer by plasma etching varies in accordance with the conditions of the polycrystalline silicon layer. For example, as described above, the etching rate of the polycrystalline silicon which is doped with an impurity is higher than that of the polycrystalline silicon which is not doped with an impurity. The present inventors, based on this phenomenon, have made an extensive study of the etching rate of plasma etching using a reaction gas of carbon fluorides for various conditions of polycrystalline silicon. In a polycrystalline silicon layer in which an impurity of high concentration is ion-implanted, the condition of plasma etching is found to be peculiar. FIG. 2 shows an example of this peculiar etching profile. FIG. 2 shows etching rates of three different polycrystalline silicon layers which are indicated by lines A, B and C when a gas mixture of $CF_4$ and $O_2$ in a ratio of 4:1 (v/v) is used as the etchant. Line A shows the etching rate of a polycrystalline silicon layer which is formed by the CVD method (with the temperature range of thermal decomposition of $SiH_4$ being 600° to 650° C.) to a thickness of 300 nm and which is not doped with an impurity. Line B shows the etching rate of a polycrystalline silicon layer of 300 nm thickness in which arsenic of high concentration is uniformly doped at a dose of about $10^{19}$ atoms/cm$^3$. Line C shows the etching rate of a polycrystalline silicon layer of 300 nm thickness in which arsenic is ion-implanted at a dose of about $10^{16}$ ions/cm$^2$ and at an acceleration voltage of 100 KeV. In order to accomplish the effect as indicated by line C, a dose of $0.5 \times 10^{16}$ to $2 \times 10^{16}$ ions/cm$^2$ is required. As is apparent from lines A and B, in the polycrystalline silicon layer which is not ion-implanted with an impurity of high concentration, etching of the layer is initiated simultaneously with the beginning of the plasma etching. As described above, the etching rate of the polycrystalline silicon layer in which an impurity is doped (indicated by line B) is higher than that of the polycrystalline silicon layer in which an impurity is not doped (indicated by line A). However, in the polycrystalline silicon layer in which arsenic of high concentration is ion-implanted (indicated by line C), etching does not occur for about the first two minutes after plasma etching is initiated. Once etching begins, the etching rate is very high, which is about 400 nm/min.

The present invention is based on this discovery. That is, when an impurity of high concentration is ion-implanted only into the region which is to remain as a pattern of the polycrystalline silicon layer, the ion-implanted region is not etched for about the first two minutes and other areas are etched when the polycrystalline silicon layer is entirely etched by plasma etching. In general, the thickness of the polycrystalline silicon pattern which is used for the semiconductor device is about 300 nm, and the polycrystalline layer of about 300 nm thickness is etched for one and a half minutes in accordance with line A. Therefore, when the plasma etching in the conditions as described above is stopped between one and a half minutes to two minutes after the initiation of the etching, the areas other than the prospective pattern formation region are completely etched, while the prospective pattern formation region into which an impurity of high concentration is ion-implanted is not substantially etched and remains. Further, since the photoresist film as a mask is not used, the side etching is substantially prevented and a polycrystalline silicon pattern with high precision may be obtained.

The reason why the peculiar profile of etching rate occurs for the polycrystalline silicon layer which is ion-implanted with an impurity of high concentration may be that a metallic barrier layer is formed in the surface of the polycrystalline silicon layer with the implanted impurity ion. In order to accomplish this effect, an impurity must be ion-implanted into the polycrystalline silicon layer with high concentration. The ion-implantation with an impurity of low concentration merely increases the etching rate of the polycrystalline silicon layer, since the barrier layer as described above is not formed therein. High concentration here means a concentration of $10^{15}$ ions/cm$^2$ or higher. When the polycrystalline silicon layer is used as a wiring or the like of the semiconductor device, the concentration of the impurity is preferably about $10^{16}$ ions/cm$^2$.

The impurities to be implanted include P, B, Ga and Sb as well as above-mentioned As. It is advantageous that a polycrystalline silicon pattern into which an impurity of high concentration is ion-implanted may be used as it is as a wiring or a resistance without further doping an impurity in order to drop the electric resistance. Further, since the impurities as described above may be used for forming a p-type or n-type semiconductor, the polycrystalline silicon pattern into which one of these impurities is ion-implanted may be used as the diffusion source of the impurity when it is directly formed on the semiconductor substrate.

Since the barrier layer for plasma etching must be formed in the surface of a polycrystalline silicon layer, ions must be implanted to a certain extent so that they do not reach deep portion of the polycrystalline silicon layer. For this purpose, when B, whose atom radius is small, is implanted, an acceleration voltage must be 100 KeV or less. When P, As, Ga or Sb, whose atom radius is large, is implanted, an acceleration voltage must be 200 KeV or less.

The process of forming a polycrystalline silicon pattern according to the present invention will be concretely described with reference to FIGS. 3A to 3D.

A polycrystalline silicon layer 12 is formed on an insulating film which is formed on a semiconductor substrate 11 or directly on the semiconductor layer 11 (FIG. 3A). The application of the polycrystalline silicon pattern determines whether the polycrystalline silicon pattern is directly formed on the semiconductor substrate 11 or on the semiconductor substrate 11 through the insulating film. For example, when the polycrystalline silicon pattern is used for the gate electrode or the wiring, the polycrystalline silicon pattern is formed on the semiconductor substrate 11 through the insulating film. On the other hand, when the polycrystalline silicon pattern is used for the diffusion source which is used for forming an impurity region, the polycrystalline silicon pattern is directly formed on the semiconductor substrate 11. In both cases, the process is completely the same. A polycrystalline silicon layer 12 is formed by the CVD method in which Si produced by thermally decomposing a silane type compound such as $SiH_4$, $SiH_3Cl$ and $SiH_2Cl_2$ is deposited. The CVD method is well known in this field, and further description thereof may be omitted here. The polycrystalline layer 12 may be formed to have n-type or p-type conductivity by introducing an impurity such as P and B into the thermal decomposition system of $SiH_4$ or the like in the CVD method. In this case, the impurity is usually introduced in the form of a compound such as $PH_3$ and $B_2H_6$. The doped polycrystalline silicon layer has a high etching rate as described above when plasma etching is performed, so that etching time is shortened and selectivity of the etching is high. Therefore, the polycrystalline silicon pattern with high precision is advantageously accomplished. As a process of forming a doped polycrystalline silicon layer, a process may be utilized in which an undoped polycrystalline silicon layer is first formed and an impurity is doped therein by thermal diffusion or the low concentration ion-implantation method.

An impurity of high concentration is selectively ion-implanted into the prospective polycrystalline silicon pattern formation region, which is to remain as a polycrystalline silicon pattern. For this purpose, areas other than the prospective polycrystalline silicon pattern formation region are covered with a protective film 13 against ion-implantation. The ion-implantation of high concentration is performed, using the protective film 13 as a mask. The protective film 13 may be a photoresist film or a CVD-SiO$_2$ film. After the impurity of high concentration is ion-implanted, the protective film 13 is removed. The protective film 13 consisting of a photoresist film may be removed by carbonization with a hot sulfuric acid or the $O_2$ plasma asher treatment. The protective film consisting of a CVD-SiO$_2$ film is removed by hydrofluoric acid. Alternatively, when the ion beam implantation method is used, the ion-implantation of high concentration can be selectively performed without using a protective film. The concentration of the impurity, the acceleration voltage, and the kind of impurity are described above.

After the protective film 13 is removed (FIG. 3C) (although the protective film is not required when the ion beam implantation method is used), plasma etching is performed for the entire surface of the polycrystalline silicon layer. As described above, the region into which ions of high concentration are implanted is not etched for about the first two minutes, and other areas are etched from the beginning of the plasma etching. Therefore, only the desired polycrystalline silicon pattern 12' may remain as shown in FIG. 3D if the plasma etching is stopped at the time when the high concentration ion-implanted region (prospective polycrystalline silicon pattern region) is not substantially etched at all while the areas other than ion implanted region are completely etched. Before plasma etching is performed, the polycrystalline silicon layer must not be heated, because the barrier layer against ion-implantation is then diffused and disappears.

EXAMPLE 1

Figure 4A:
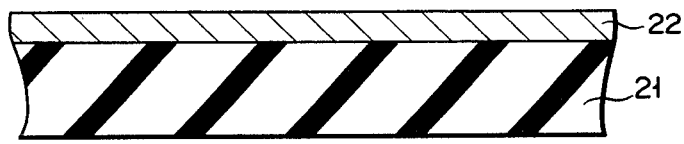
FIGS. 4A to 4E and 5A to 5F are sectional views showing embodiments of the present invention, respectively.

(I) As shown in FIG. 4A, a polycrystalline silicon layer 22 of 300 nm thickness was formed on an insulating film 21 which is formed on a semiconductor substrate (not shown) by the CVD method (with the temperature of thermal decomposition of $SiH_4$ being 600° C.).

Figure 4B:
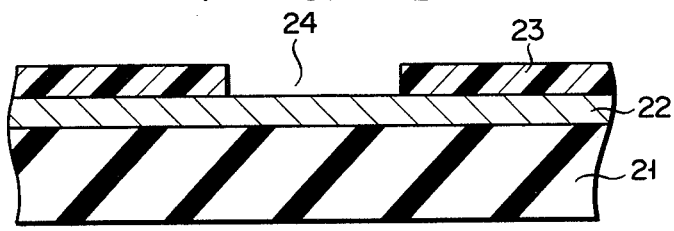

(II) As shown in FIG. 4B, after a photoresist film 23 was coated on the polycrystalline silicon layer 22, a contact hole 24 was formed on a prospective pattern formation region of the polycrystalline silicon layer 22 by Photo Engraving Method.

Figure 4C:
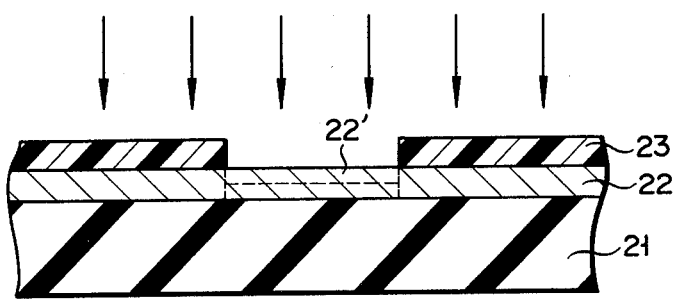

(III) Arsenic was ion-implanted into the polycrystalline silicon layer 22 at a dose of $1 \times 10^{16}$ ions/cm$^2$ and at an acceleration voltage of 100 KeV, using the pattern of the photoresist film 23 as a mask (FIG. 4C). Therefore, a polycrystalline silicon pattern 22' in which arsenic of high concentration is ion-implanted was formed at the prospective polycrystalline silicon pattern region.

Figure 4D:
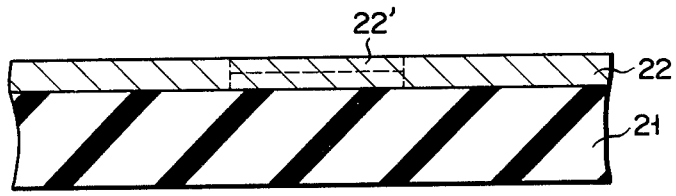
Figure 4E:
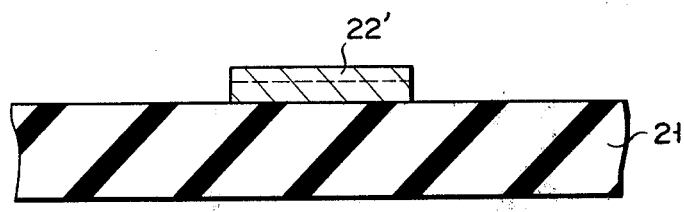

(IV) As shown in FIG. 4D, the pattern of the photoresist film 23 was removed by the hot sulfuirc acid treatment, and plasma etching was performed for one minute and forty-five seconds in an atmosphere of a gas mixture of $CF_4$ and $O_2$ ($CF_4:O_2 = 4:1$). The $O_2$ plasma asher treatment may be performed instead of the hot sulfuric acid treatment. Therefore, the polycrystalline silicon pattern 22' remained and other areas were etched off (FIG. 4E).

As is apparent from line A of FIG. 2, the etching time which is required for etching the polycrystalline silicon layer of 300 nm thickness is one and a half minutes. In practice, plasma etching was, however, performed for one minute and forty-five seconds. This is because the possibility that the thickness of the polycrystalline silicon layer is not uniform and some areas may have a thickness of 300 nm or more was taken into consideration.

The polycrystalline silicon pattern which was formed in the above example was not substantially affected by side etching and has high precision.

EXAMPLE 2

Figure 5A:
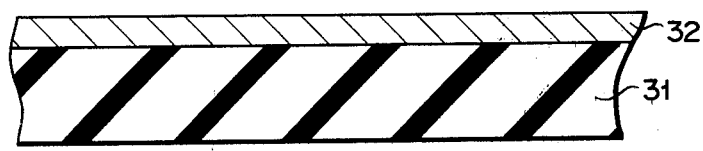

(I) As shown in FIG. 5A, a polycrystalline silicon layer 32 is deposited, on an insulating film 31 which is formed on a semiconductor substrate (not shown), to a thickness of 300 nm by the CVD method in the same manner as in Example 1.

Figure 5B:
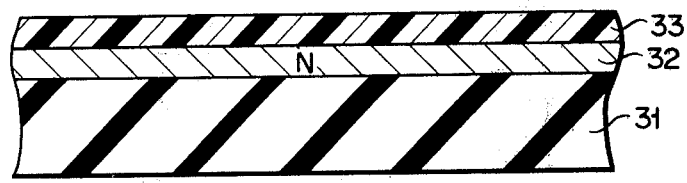

(II) As shown in FIG. 5B, an arsenic-doped CVD-SiO$_2$ film 33 is deposited on the polycrystalline silicon layer 32. Subsequently, the CVD-SiO$_2$ film is heated so that arsenic which is doped in the CVD-SiO$_2$ film 33 is diffused into the polycrystalline silicon layer 32. Therefore, an n-type polycrystalline silicon layer with an arsenic concentration of $10^{19}$ atoms/cm$^3$ is prepared.

Figure 5C:
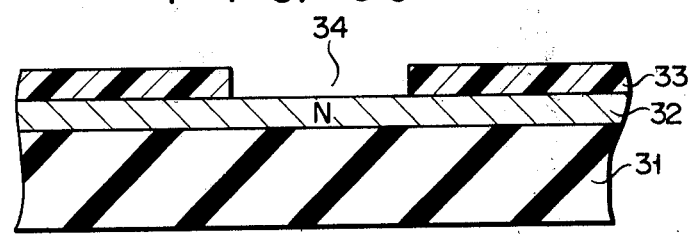

(III) As shown in FIG. 5C, the CVD-SiO$_2$ film on a prospective pattern formation region of the n-type polycrystalline silicon layer 32 is etched by photoengraving to form a contact hole 34.

Figure 5D:
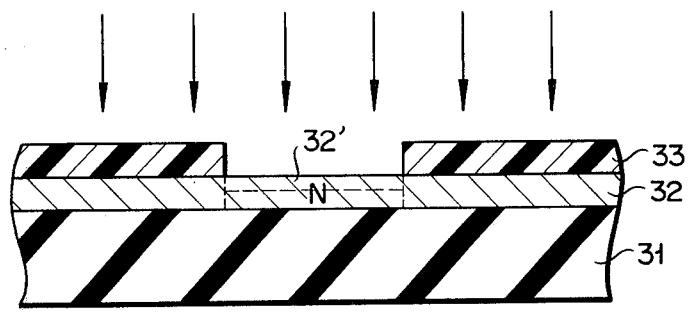

(IV) As shown in FIG. 5D, arsenic is ion-implanted at a dose of $5 \times 10^{15}$ ions/cm$^2$ and at an acceleration voltage of 100 KeV, using the CVD-SiO$_2$ film 33 as a mask. Therefore, a prospective region for a polycrystalline silicon pattern 32' in which arsenic of high concentration is doped is formed in part of the n-type polycrystalline silicon layer 32.

Figure 5E:
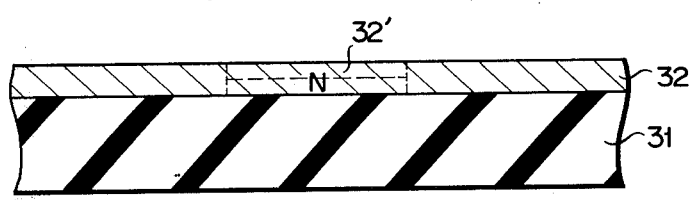
Figure 5F:
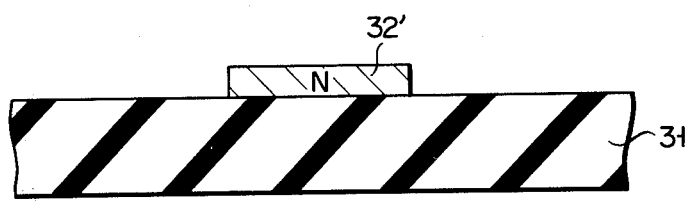

(V) As shown in FIG. 5E, the CVD-SiO$_2$ film 33 is removed by etching with hydrofluoric acid.

(VI) Finally, plasma etching is performed in the same manner as in Example 1, so that the areas other than the region in which arsenic of high concentration is ion-implanted are etched to obtain the polycrystalline silicon pattern 32'.

In this example, the etching time may be half of the etching time of Example 1, that is, about 50 seconds. The obtained polycrystalline silicon pattern is more precise than that of Example 1, because the arsenic-doped polycrystalline silicon layer 32 is used, so that the etching rate of this polycrystalline silicon layer 32, as shown by line B in FIG. 2, is higher than the polycrystalline silicon layer 22 of Example 1. As a result, the etching time is shortened and selective etching is easily performed.

In Examples 1 and 2, the impurity of high concentration is selectively ion-implanted, using a mask. Alternatively, when the ion beam implantation method is used, selective ion-implantation is performed with an impurity of high concentration without using a mask. When the ion beam implantation method is used, the polycrystalline silicon layer may be patterned without using PEP process, thus simplifying the process of forming the polycrystalline silicon pattern.

The method of forming a wiring, resistance, or electrode of a semiconductor device made of polycrystalline silicon according to the process of the present invention will now concretely be described.

Figure 6:
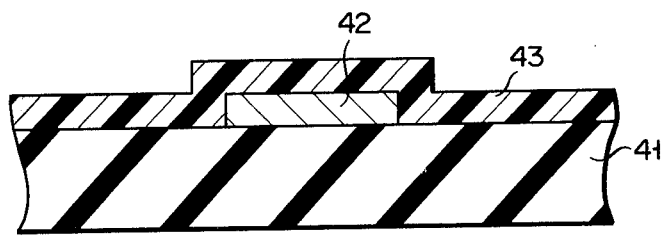
FIG. 6 is a view showing a structure of a wiring or a resistance made of the polycrystalline silicon pattern formed according to the process of the present invention.

FIG. 6 shows a structure of a semiconductor device in which a polycrystalline silicon pattern is used as a wiring (or resistance). In this semiconductor device, an insulating film 41 is formed on a semiconductor substrate (not shown). A wiring (or resistance) 42 which is made of the polycrystalline silicon pattern is selectively formed. Further, a passivation film 43 is formed to cover the entire surface. When the present invention is applied to the formation of the wiring (or resistance), side etching is substantially eliminated and the wiring is formed with high precision, so that an elaborate wiring is performed with high precision for a highly integrated semiconductor device, and the high precision of the electric resistance value of the resistance is well achieved. Further, in a wiring or resistance made of polycrystalline silicon, electric resistance is reduced by doping an impurity for practical use. The polycrystalline silicon pattern which is formed according to the present invention is already doped with an impurity, offering a great advantage.

The case is described with reference to FIGS. 7A to 7G in which an emitter electrode of a high frequency npn bipolar transistor with the shallow junction structure is formed according to the process of the present invention.

EXAMPLE 3

Figure 7A:
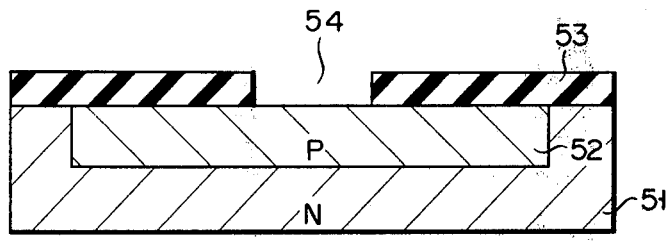
FIGS. 7A to 7G are sectional views for explaining the process for forming a polycrystalline silicon pattern which is used as an electrode of a semiconductor device, according to the process of the present invention.

(I) A p-type base region 52 was formed on an n-type silicon semiconductor substrate 51 which also served as a collector region, in accordance with the conventional process for manufacturing npn transistors. The entire surface thereof was thermally oxidized to form an insulating film 53 made of silicon dioxide. The insulating film 53 convering the prospective n-type emitter formation region was etched by photoengraving, so that a contact hole 54 was formed (FIG. 7A).

Figure 7B:
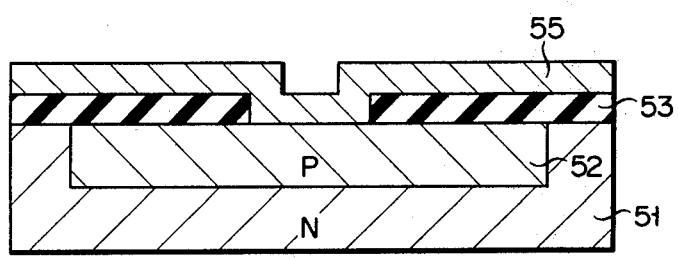

(II) A polycrystalline silicon layer 55 of 300 nm thickness was deposited to cover the entire surface by the CVD method (with the temperature range of thermal decomposition being 600° to 650° C.) (FIG. 7B).

Figure 7C:
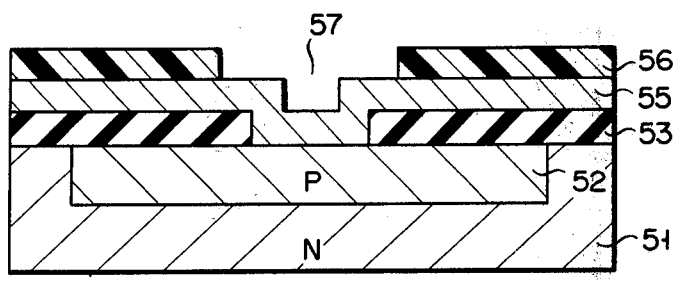

(III) Subsequently, an $SiO_2$ insulating film 56 was deposited thereon to a thickness of 200 to 400 nm by the epitaxial method. A contact hole 57 was formed on the $SiO_2$ insulating film 56 by photoengraving which utilized an etchant of the hydrofluoric acid type. Therefore, only the prospective region for an emitter electrode 55' was exposed (FIG. 7C).

Figure 7D:
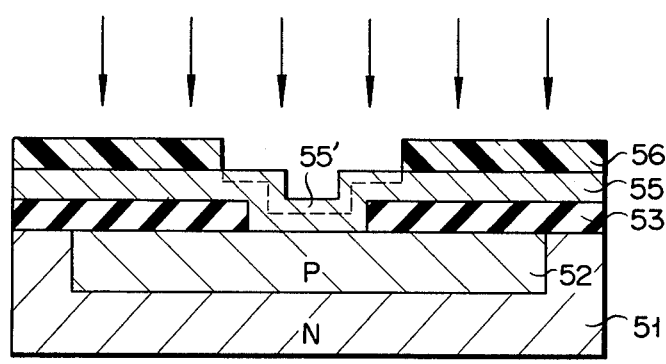

(IV) Arsenic was ion-implanted at a dose of $1 \times 10^{16}$ ions/cm$^2$ and at an acceleration voltage of 100 KeV, using the $SiO_2$ insulating film 56 as a mask. Therefore, the prospective emitter electrode formation region 55' of the polycrystalline silicon layer 55 was selectively ion-implanted with arsenic (FIG. 7D).

In this condition, the arsenic ion is of a low penetration power, so that it does not pass through the polycrystalline silicon layer 55 into the p-type base region 52. On the other hand, into the areas which are protected by the $SiO_2$ insulating film 56, arsenic ion is not implanted since it is interrupted by the film 56. Further, the $SiO_2$ insulating film 56 and the polycrystalline silicon layer 55 act as buffer members against the impact of ion-implantation, so that degradation of the surface conditions of the insulating film 53 and instability of the p-type base region 52 and the surface of the n-type silicon semiconductor substrate 51 are prevented.

Figure 7E:
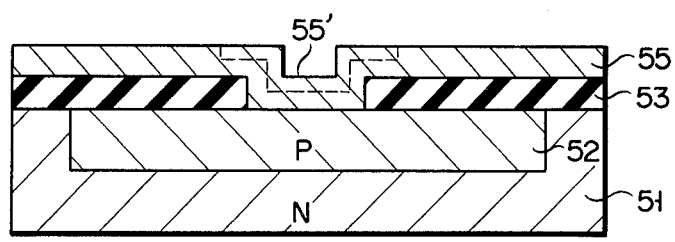

(VI) The $SiO_2$ insulating film 56 was etched with an etchant of the hydrofluoric acid type (FIG. 7E).

Figure 7F:
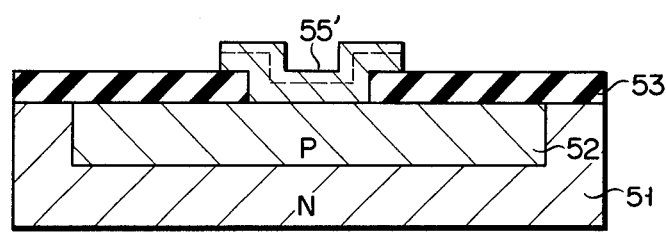
Figure 7G:
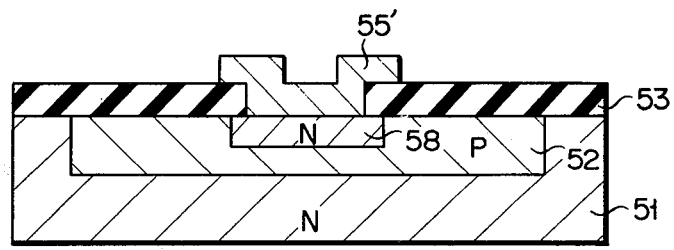

(VII) Plasma etching was performed for one minute and forty-five seconds using a gas mixture of $CF_4$ and $O_2$ ($CF_4:O_2=4:1$). The areas of the polycrystalline silicon layer 55 other than the region into which arsenic ion was implanted (prospective emitter electrode formation region 55') were etched off to leave the desired polycrystalline silicon pattern (emitter electrode) 55' (FIG. 7F).

(VIII) Finally, heat treatment was performed to diffuse arsenic which was implanted into the polycrystalline silicon pattern 55' into the p-type base region 52. Therefore, the n-type emitter region 58 was formed.

In the manner as described above, the npn bipolar transistor is formed. The polycrystalline silicon pattern 55' whose electric resistance is dropped by doping arsenic may be used as the electrode of the n-type emitter region 58 without further treatment.

The precision of the polycrystalline silicon pattern 55' which is used as the emitter electrode and which is formed in this example is very high. Further, as described above, since the silicon semiconductor substrate 51 is protectd from the impact of ion-implantation, the instability of the surface of the silicon substrate does not occur. As a result, the npn bipolar transistor which is accomplished in this example has more excellent electric characteristics than the npn bipolar transistor which is manufactured by the conventional process in which an undoped polycrystalline silicon layer is deposited by the CVD method and plasma etching is performed using a photoresist film as a mask to form a polycrystalline silicon pattern, and thereafter ion-implantation is performed on the entire surface of the transistor. FIG. 8 shows this difference. Curve Y shows electric characteristics of the npn transistor which is formed according to the process of the present invention, while curve X shows the electric characteristics of the npn transistor which is formed by the conventional process. As shown in FIG. 8, in the conventional npn bipolar transistor, the static forward current transfer ratio $h_{FE}$ is abruptly reduced where the collector current is small, while in the npn bipolar transistor by the process of the present invention, high $h_{FE}$ is maintained.

It is apparent that the semiconductor device with the structure as shown in FIG. 9 may be obtained by the same process as Example 3 except that a p-type silicon semiconductor substrate 61 is used and a passivation film 65 covers the entire surface. In this case, a polycrystalline silicon pattern 64 with high precision is accomplished in the same manner as in Example 3. This polycrystalline silicon pattern 64 is used as the diffusion source to form an impurity region 62 with stability. Further, the surface of the silicon semiconductor substrate 61 is not damaged.

The process of forming a polycrystalline silicon pattern according to the present invention is apparently applicable to manufacture of MOS transistors, diodes and I²L.

In summary, according to the present invention, the polycrystalline silicon pattern is formed with high precision. As a result, an elaborate semiconductor device is accomplished. Further, when a semiconductor device is formed according to the process of the present invention, the semiconductor device with excellent electric characteristics is accomplished.

What we claim is:

1. A process of forming a polycrystalline silicon pattern which comprises the steps of:

selectively ion-implanting an impurity with high concentration into the region of a polycrystalline silicon layer, which is to remain as a polycrystalline silicon pattern; and plasma-etching the whole of said polycrystalline silicon layer, thereby etching off the areas other than said region into which said impurity is ion-implanted with high concentration.

2. The process according to claim 1, wherein said impurity is ion-implanted at a dose of not less than $10^{15}$ ions/cm².

3. The process according to claim 1, wherein said impurity is boron.

4. The process according to claim 3, wherein said impurity is ion-implanted with high concentration at an acceleration voltage of 100 KeV or less.

5. The process according to claim 1, wherein said impurity is selected from the group consisting of phosphorus, arsenic, gallium, and antimony.

6. The process according to claim 5, wherein said impurity is ion-implanted with high concentration at an acceleration voltage of 200 KeV or less.

7. The process according to claim 1, wherein said polycrystalline silicon layer is doped with an impurity in advance.

8. The process according to any one of claims 1 to 7, wherein the step of selectively ion-implanting the impurity into said region of said polycrystalline silicon layer is effected by forming a protective film, against ion-implantation, on the areas of said polycrystalline silicon layer other than said region into which said impurity is to be ion-implanted, and ion-implanting the impurity with high concentration into the entire surface of said polycrystalline silicon layer using said protective film as a mask.

9. The process according to claim 8, wherein said protective film against the ion-implantation is selected from the group consisting of a photoresist film and a CVD-SiO₂ film.

10. The process according to any one of claims 1 to 7, wherein the step of selectively ion-implanting the impurity into said region of said polycrystalline silicon layer is effected by ion-implanting the impurity with high concentration into said region by the ion beam implantation method in a spotting manner.

11. The process according to claim 1, wherein said polycrystalline silicon pattern is used as a wiring, resistance or electrode of a semiconductor device.

12. The process according to claim 11, wherein said electrode is formed to be in ohmic contact with a semiconductor substrate.

13. The process according to claim 12, further comprising the step of conducting a heat treatment after said electrode is formed, thereby diffusing the impurity in said electrode into said semiconductor substrate to form an impurity region in said semiconductor substrate.

14. The process according to claim 11 or 13, wherein said semiconductor device is selected from the group consisting of a bipolar transistor, a MOS transistor, a diode and an I²L.

15. A process according to claim 13, wherein said semiconductor device is a bipolar transistor and said impurity region is an emitter region.

16. The process according to claim 1, wherein said plasma-etching is stopped at the time when said areas not subjected to said ion-implantation have been completely etched off and before the etching of said region into which ions are implanted has begun.

* * * * *